United States Patent
Pande et al.

(12) 
(10) Patent No.: US 9,954,514 B2
(45) Date of Patent: Apr. 24, 2018

(54) OUTPUT RANGE FOR INTERPOLATION ARCHITECTURES EMPLOYING A CASCADED INTEGRATOR-COMB (CIC) FILTER WITH A MULTIPLIER

(71) Applicant: Texas Instruments Incorporated, Dallas, TX (US)

(72) Inventors: Tarkesh Pande, Richardson, TX (US); Srinivas Lingam, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 248 days.

(21) Appl. No.: 14/624,218

(22) Filed: Feb. 17, 2015

(65) Prior Publication Data
US 2015/0236670 A1    Aug. 20, 2015

Related U.S. Application Data (60) Provisional application No. 61/940,177, filed on Feb. 14, 2014.

(51) Int. Cl.
*H03H 17/06* (2006.01)

(52) U.S. Cl.
CPC .................. *H03H 17/0671* (2013.01)

(58) Field of Classification Search
None
See application file for complete search history.

(56) References Cited

U.S. PATENT DOCUMENTS

| | | | | |
|---|---|---|---|---|
| 7,196,648 B1* | 3/2007 | Ding | ................. | H03H 17/0685 341/144 |
| 7,324,025 B1* | 1/2008 | Ding | ................. | H03H 17/0671 341/118 |
| 7,856,464 B2* | 12/2010 | Tinker | ............... | H03H 17/0671 341/61 |
| 9,135,220 B2* | 9/2015 | Sedlak | ............... | H03H 17/0664 |
| 2004/0148319 A1* | 7/2004 | Bossmeyer | ........ | H03H 17/0286 708/200 |
| 2007/0230642 A1* | 10/2007 | Wu | .................... | H03H 17/0671 375/350 |
| 2010/0135368 A1* | 6/2010 | Mehta | .................... | H04L 27/38 375/219 |

* cited by examiner

*Primary Examiner* — Michael D. Yaary
(74) *Attorney, Agent, or Firm* — John R. Pessetto; Charles A. Brill; Frank D. Cimino (57) ABSTRACT

A cascaded integrator-comb filter (CIC) that includes a differentiator, a rate changer, an integrator, and a multiplier. The differentiator is configured to differentiate an input signal to produce a differentiated input signal. The rate changer is coupled to the differentiator and is configured to interpolate the differentiated input signal based on an interpolation rate to produce an upsample signal. The integrator is coupled to the rate changer and is configured to integrate the upsample signal to produce an output signal. The multiplier is coupled to the differentiator, rate changer, and integrator and is configured to increase the output signal amplitude based on the interpolation rate.

20 Claims, 4 Drawing Sheets

OUTPUT RANGE FOR INTERPOLATION ARCHITECTURES EMPLOYING A CASCADED INTEGRATOR-COMB (CIC) FILTER WITH A MULTIPLIER

CROSS-REFERENCE TO RELATED APPLICATIONS

The present application claims priority to U.S. Provisional Patent Application No. 61/940,177, filed Feb. 14, 2014, titled "IMPROVING THE OUTPUT RANGE FOR INTERPOLATION ARCHITECTURES EMPLOYING A CASCADED INTEGRATOR-COMB (CIC) USING A MULTIPLIER," which is hereby incorporated herein by reference in its entirety.

BACKGROUND

Cascaded integrator-comb (CIC) filters may be utilized in digital circuits to change the sample rate of a digital signal. In many cases, CIC filters are utilized to interpolate, or increase, the sample rate of a digital signal after processing by a digital signal processor (DSP) at a certain sample rate so that the signal can be converted by a digital-to-analog converter (DAC) requiring a different sample rate to an analog signal for use by analog devices. A CIC filter is configured to change the sample rate of a signal utilizing only differentiators (subtractors) and integrators (adders).

SUMMARY

The problems noted above are solved in large part by systems and methods for improving the output range for interpolation architectures employing a cascaded integrator-comb (CIC) filter with a multiplier. In some embodiments, a CIC filter includes a a differentiator, a rate changer, an integrator, and a multiplier. The differentiator is configured to differentiate an input signal to produce a differentiated input signal. The rate changer is coupled to the differentiator and is configured to interpolate the differentiated input signal based on an interpolation rate to produce an upsample signal. The integrator is coupled to the rate changer and is configured to integrate the upsample signal to produce an output signal. The multiplier is coupled to the differentiator, rate changer, and integrator and is configured to increase the output signal amplitude based on the interpolation rate.

Another illustrative embodiment is a system that includes a digital signal processor (DSP), a CIC filter, and a digital-to-analog converter (DAC). The DSP is configured to produce an input signal at a first rate. The CIC filter is coupled to the DSP and is configured to receive the input signal and produce an output signal at a second rate based on an interpolation rate. The CIC includes a multiplier that is configured to increase the output signal amplitude based on the interpolation rate. The DAC is coupled to the DSP and CIC filter and is configured to receive the output signal.

Yet another illustrative embodiment is a method of producing a signal in a CIC filter that includes differentiating an input signal to produce a differentiated input signal. The method also includes multiplying, by a multiplier, the differentiated input signal by a multiplication value to produce a multiplied differentiated input signal. The multiplication value is based on an interpolation rate. The method also includes interpolating the multiplied differentiated input signal based on the interpolation rate to produce an upsample signal. The method also includes integrating the upsample signal to produce an output signal.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Cascaded integrator-comb (CIC) filters may be utilized by a variety of digital circuits to increase (upsample) or decrease (down sample) a sample rate for a digital signal. In many circuits, the CIC filter upsamples a digital input signal that is produced by, for example, a digital signal processor (DSP) for conversion by a digital-to-analog converter (DAC) to an analog signal. In many cases, the DAC requires a different sample rate than the sample rate of the signal produced by the DSP; therefore, a CIC filter may be utilized to effectuate the sample rate change for the signal.

A CIC filter typically contains only differentiators (subtractors), integrators (adders), and a rate changer. A typical CIC filter does not have any multipliers. For an interpolating CIC filter (i.e., a CIC filter that upsamples a rate in a signal), an input signal is received by any number of differentiators to differentiate the signal. The sample rate of the signal is then upsampled by a rate changer to increase the rate. Finally, the signal is received by any number of integrators (in many cases, the same number of integrators as differentiators) to integrate the signal. The signal is then output from the CIC filter. However, depending on the interpolation rate in the CIC filter, the amplitude of the signal may decrease from input to output. For CIC filter interpolation rates that are a power of 2 (i.e., 2, 4, 8, 16, 32, 64, etc.), the amplitude of the input signal is generally not reduced, but for all other interpolation rates, a reduction in amplitude for the input signal of the CIC filter is inherent in the filter.

In many applications, such as powerline and/or wireless communications, it is important to maintain as much power as possible in the system. Therefore, a loss of amplitude for any signal processed by the system is undesirable. Because the CIC filter inherently causes a loss of amplitude for any input signal when the interpolation rate is a non-power of 2, the disclosed embodiments can compensate for this loss. In some embodiments, a multiplier is added to a CIC filter to preserve the amplitude of the input signal. Because the loss of amplitude in a CIC filter is dependent on the interpolation rate and the CIC order (i.e., the number of differentiators or the number of integrators in the CIC filter), the multiplication value of the multiplier depends on the interpolation rate and/or the CIC order. The multiplier may be configured to increase the amplitude of the signal, such that the amplitude of the output signal is substantially equal to the amplitude of the input signal. This allows all of the bits in the signal to be received by the DAC allowing the DAC to utilize its entire dynamic range.

Because many rate changers need to support multiple rates and the CIC filter may support different applications that have different standards, formats, and/or bands, the rate changer of the CIC filter may be required to support multiple interpolation rates. Therefore, because the multiplication value of the multiplier depends on the interpolation rate of the CIC filter, the multiplier may be programmable, such that the multiplication value may be programmed to any value and/or changed so as to always allow the multiplier to increase the signal such that the amplitude of the output signal equals the amplitude of the input signal. Thus, a digital circuit that utilizes a CIC filter with a multiplier that multiplies a signal within the CIC filter based on the interpolation rate of the filter is capable of providing the DAC with a signal that has an increased sample rate while maintaining the amplitude of the signal for all interpolation rates.

Figure 1:
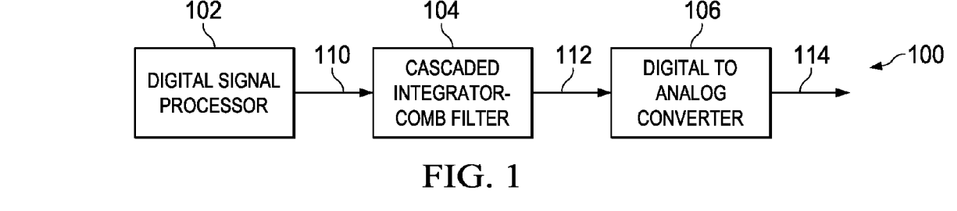
FIG. 1 shows a block diagram of an illustrative digital signal processing system in accordance with various embodiments.

FIG. 1 shows a block diagram of an illustrative digital signal processing system 100 in accordance with various embodiments. Digital signal processing system 100 includes a digital signal processor (DSP) 102, cascaded integrator-comb (CIC) filter 104, and digital-to-analog converter (DAC) 106. DSP 102, CIC filter 104 and DAC 106 are all coupled to one another.

In an embodiment, DSP 102 is a microprocessor with an architecture that is optimized for digital signal processing. However, DSP 102 may be any processing device that is capable of digital signal processing including semiconductor intellectual property cores, application-specific integrated circuits (ASICs), field-programmable gate arrays (FPGAs), digital signal controllers, stream processors, and general purpose microprocessors. DSP 102 may digitally process a signal by mathematically manipulating the signal to improve it in some way such as sampling the signal. After the signal processing, DSP 102 provides a digital signal 110 to the CIC filter 104. Signal 110 is referred to as an input signal to the CIC filter and has a particular an input sample rate (i.e., the number of samples of the signal carried per second).

In an embodiment, CIC filter 104 receives the input signal 110 from DSP 102. In alternative embodiments, CIC filter 104 receives input signal 110 from any device capable of providing a digital signal. CIC filter 104 may be a finite impulse response filter that may be configured to interpolate or decimate the input signal 110. In other words, CIC filter 104 is a filter that is configured to convert the sampled digital input signal 110 to a higher sampling rate (i.e., upsampling) or to a lower sampling rate (i.e., downsampling) and produce output signal 112 at either a higher or lower sample rate than the sample rate of the input signal 110. For example, when CIC filter 104 is configured for interpolation, CIC filter 104 receives the input signal 110 at a first sample rate and produces an output signal 112 at a second, higher, sample rate based on an interpolation rate (i.e., the amount of interpolation rate change or the upsampling rate) built into CIC filter 104.

DAC 106 receives the output signal 112, which is a digital signal, and converts the digital data into an analog signal 114. Analog signal 114 may feed any type of device that requires or uses an analog signal. Some such devices include any type of speaker for audio signals, USB speakers, sound cards, monitors for video signals, etc. However, other devices may require or use an analog signal. DAC 106 may be any type of electronic DAC including a pulse-width modulator, an oversampling DAC, an interpolating DAC, binary-weighted DAC, a R-2R ladder DAC, a successive-approximation DAC, a thermometer-coded DAC, a hybrid DAC, or any other type of DAC.

Figure 2:
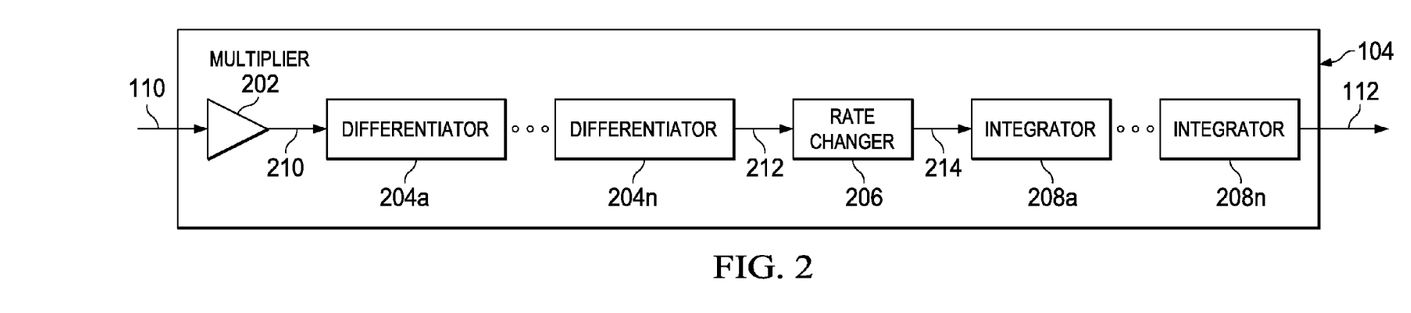
FIG. 2 shows a block diagram of an illustrative cascaded integrator-comb (CIC) filter with a multiplier in accordance with various embodiments.

FIG. 2 shows a block diagram of an illustrative CIC filter 104 with a multiplier 202 in accordance with various embodiments. In the embodiment shown in FIG. 2, CIC filter 104 includes multiplier 202, one or more differentiators 204a-204n, rate changer 206, and one or more integrators 208a-208n.

In the example of FIG. 2, input signal 110 is received by multiplier 202. Multiplier 202, in an embodiment, is a multiplier that generates a scaled version of its input signal. For example, input signal 110 is received by multiplier 202 which multiplies the amplitude of the input signal 110 to create a multiplied input signal 210. Multiplied input signal 210 thus has an amplitude that is a multiple of the input signal 110, but the frequency and sample rate remain the same.

Multiplied input signal 210 is then received by the differentiators 204. Differentiators 204 preferably are comb filter pairs which differentiate the multiplied input signal 210 to produce a differentiated input signal 212. The differentiated input signal 212 is directly proportional to the rate of change (i.e., the time derivative) of the input signal to the differentiators 204 (i.e., multiplied input signal 210). Differentiators 204, thus, provide a delayed version of multiplied input signal 210 to produce the differentiated input signal 212.

Rate changer 206 receives the differentiated input signal 212 and changes the sample rate of the signal. In an embodiment, rate changer 206 is an upsampler (e.g., zero-stuffer) which upsamples the sample rate of the differentiated input signal 212 to produce an upsample signal 214. Thus, the sample rate of upsample signal 214 is higher than the sample rate of input signal 110. Integrators 208 receive the upsample signal 214 and integrate the signal. Thus, integrators 208 produce an output signal 112 that is a time integral of upsample signal 214. Output signal 112 then may be received by DAC 106.

Multiplier 202 is programmable and configured to increase the amplitude of output signal 112. In other words, the multiplication value of multiplier 202 is programmable and may be programmed such that the amplitude of output signal 112 is higher than if CIC filter 104 did not have multiplier 202. While multiplier 202 is multiplying input signal 110, the resulting output signal 112 of CIC filter 104 may have a higher amplitude based on the multiplication of input signal 110. Without multiplier 202, in some embodiments, output signal 112 would have a lower amplitude than input signal 110, therefore, multiplier 202 may be programmed to increase the amplitude of output signal 112 such that it is the same as the amplitude of input signal 110. In other words, multiplier 202 may be configured to increase the amplitude of output signal 112 so that there is not a loss of amplitude in the output signal 112 of CIC filter 104.

The multiplication value of multiplier 202 may be based on the interpolation rate of rate changer 206 and/or the CIC filter 104 order. In other words, the multiplication value of multiplier 202 depends on the interpolation rate and/or the CIC filter 104 order. The CIC filter 104 order is the number of differentiators 204 or the number of integrators 208 in CIC filter 104. In some embodiments, the number of differentiators 204 equals the number of integrators 208.

Figure 3:
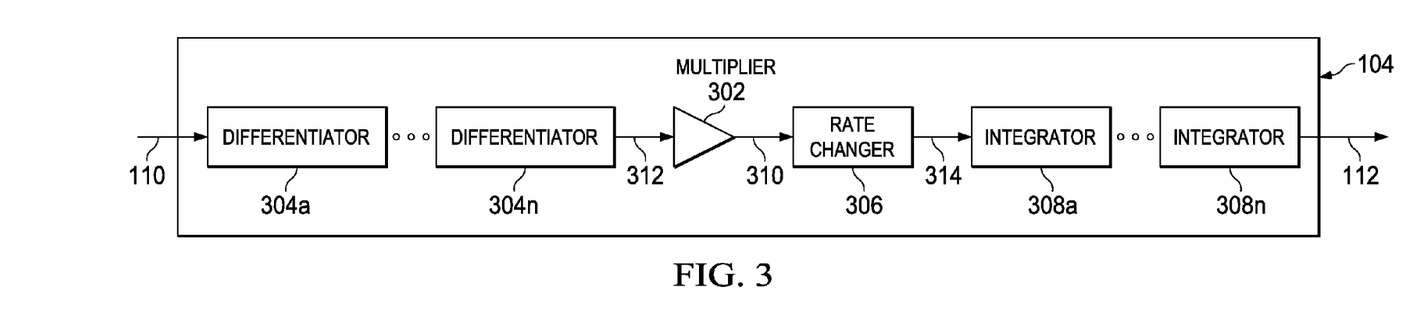
FIG. 3 shows a block diagram of an illustrative CIC filter with a multiplier in accordance with various embodiments.

FIG. 3 shows a block diagram of an illustrative CIC filter 104 with a multiplier 302 in accordance with various embodiments. The embodiment shown in FIG. 3 is similar to the embodiment shown in FIG. 2 except that multiplier 302 from FIG. 3 is located in a different location within CIC filter 104 than multiplier 202 from FIG. 2. In the embodiment shown in FIG. 3, CIC filter 104 includes multiplier 302, one or more differentiators 304a-304n, rate changer 306, and one or more integrators 308a-308n.

In the example of FIG. 3, input signal 110 is received by differentiators 304. Differentiators 304 preferably are comb filter pairs which differentiate input signal 110 to produce a differentiated input signal 312. The differentiated input signal 312 is directly proportional to the rate of change (i.e., the time derivative) of the input signal (i.e., input signal 110). Differentiators 304, thus, provide a delayed version of input signal 110 to produce differentiated input signal 312.

Differentiated input signal 312 is received by multiplier 302. Multiplier 302, in an embodiment, is a multiplier that generates a scaled version of its input signal. For example, differentiated input signal 312 is received by multiplier 302 which multiplies the amplitude of the differentiated input signal 312 to create a multiplied differentiated input signal 310. Multiplied differentiated input signal 310 thus has an amplitude that is a multiple of the differentiated input signal 312, but the frequency and sample rate remain the same. Because multiplier 302 performs multiplication on differentiated input signal 312 after differentiation by differentiators 304, but before upsampling by rate changer 306, a less expensive, less complex multiplier is required due to the multiplication on a signal with a lower sample rate that has already been differentiated.

Rate changer 306 receives multiplied differentiated input signal 310 and changes the sample rate of the signal. In an embodiment, rate changer 306 may be an upsampler (e.g., zero-stuffer) which upsamples the sample rate of multiplied differentiated input signal 310 to produce an upsample signal 314. Thus, the sample rate of upsample signal 314 is higher than the sample rate of input signal 110. Integrators 308 receive the upsample signal 314 and integrate the signal. Thus, integrators 308 produce an output signal 112 that is a time integral of upsample signal 314. Output signal 112 then may be received by DAC 106.

Multiplier 302 is programmable and configured to increase the amplitude of output signal 112. In other words, the multiplication value of multiplier 302 is programmable and may be programmed such that the amplitude of output signal 112 is higher than if CIC filter 104 did not have multiplier 302. While multiplier 302 is multiplying differentiated input signal 312, the resulting output signal 112 of CIC filter 104 may have a higher amplitude based on the multiplication of differentiated input signal 312. Without multiplier 302, in some embodiments, output signal 112 would have a lower amplitude than input signal 110, therefore, multiplier 302 may be programmed to increase the amplitude of output signal 112 such that it is the same as the amplitude of input signal 110. In other words, multiplier 302 may be configured to increase the amplitude of output signal 112 so that there is not a loss of amplitude in the output signal 112 of CIC filter 104.

The multiplication value of multiplier 302 may be based on the interpolation rate of rate changer 306 and/or the CIC filter 104 order. In other words, the multiplication value of multiplier 302 depends on the interpolation rate and/or the CIC filter 104 order. The CIC filter 104 order is the number of differentiators 304 or the number of integrators 308 in CIC filter 104. In some embodiments, the number of differentiators 304 equals the number of integrators 308.

Figure 4:
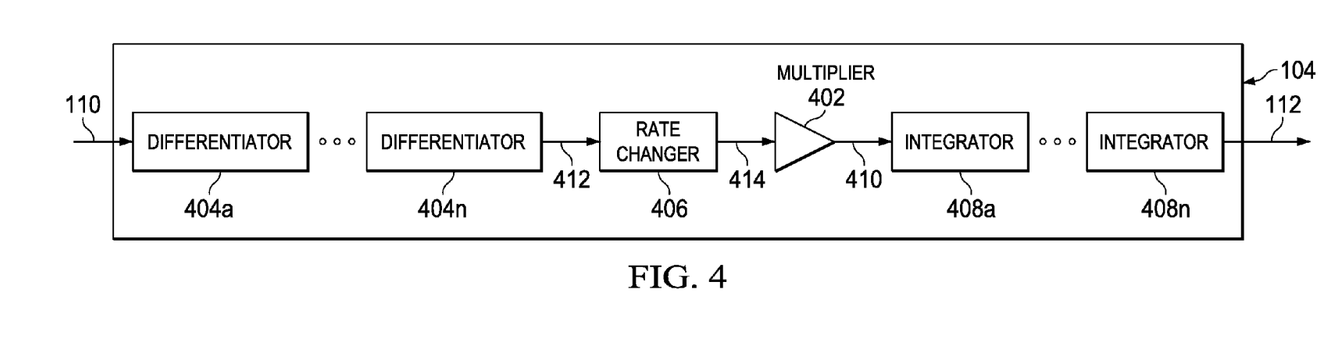
FIG. 4 shows a block diagram of an illustrative CIC filter with a multiplier in accordance with various embodiments.

FIG. 4 shows a block diagram of an illustrative CIC filter 104 with a multiplier 402 in accordance with various embodiments. The embodiment shown in FIG. 4 is similar to the embodiments shown in FIGS. 2 and 3 except that multiplier 402 from FIG. 4 is located in a different location within CIC filter 104 than multipliers 202 and 302 from FIGS. 2 and 3 respectively. In the embodiment shown in FIG. 4, CIC filter 104 includes multiplier 402, differentiators 404a-404n, rate changer 406, and integrators 408a-408n. While multiple differentiators 404 and integrators 408 are depicted, any number of differentiators 404 and integrators 408, including only one each, may be included in CIC filter 104.

In the example of FIG. 4, input signal 110 is received by differentiators 404. Differentiators 404 are preferably comb filter pairs which differentiate input signal 110 to produce a differentiated input signal 412. The differentiated input signal 412 is directly proportional to the rate of change (i.e., the time derivative) of the input signal (i.e., input signal 110). Differentiators 404, thus, provide a delayed version of input signal 110 to produce differentiated input signal 412.

Rate changer 406 receives differentiated input signal 412 and changes the sample rate of the signal. In an embodiment, rate changer 406 may be an upsampler (e.g., zero-stuffer) which upsamples the sample rate of differentiated input signal 412 to produce an upsample signal 414. Thus, the sample rate of upsample signal 414 is higher than the sample rate of input signal 110.

Upsample signal 414 is received by multiplier 402. Multiplier 402, in an embodiment, is a multiplier that generates a scaled version of its input signal. For example, upsample signal 414 is received by multiplier 402 which multiplies the amplitude of upsample signal 414 to create a multiplied upsample signal 410. Multiplied upsample signal 410 thus has an amplitude that is a multiple of the upsample signal 414, but the frequency and sample rate remain the same. Integrators 408 receive multiplied upsample signal 414 and integrate the signal. Thus, integrators 408 produce an output signal 112 that is a time integral of multiplied upsample signal 414. Output signal 112 then may be received by DAC 106.

Multiplier 402 is programmable and configured to increase the amplitude of output signal 112. In other words, the multiplication value of multiplier 402 is programmable and may be programmed such that the amplitude of output signal 112 is higher than if CIC filter 104 did not have multiplier 402. While multiplier 402 is multiplying upsample signal 414, the resulting output signal 112 of CIC filter 104 may have a higher amplitude based on the multiplication of upsample signal 414. Without multiplier 402, in some embodiments, output signal 112 would have a lower amplitude than input signal 110, therefore, multiplier 402 may be programmed to increase the amplitude of output signal 112 such that it is the same as the amplitude of input signal 110. In other words, multiplier 402 may be configured to increase the amplitude of output signal 112 so that there is not a loss of amplitude in the output signal 112 of CIC filter 104.

The multiplication value of multiplier 402 may be based on the interpolation rate of rate changer 406 and/or the CIC filter 104 order. In other words, the multiplication value of multiplier 402 depends on the interpolation rate and/or the CIC filter 104 order. The CIC filter 104 order is the number of differentiators 404 or the number of integrators 408 in CIC filter 104. In some embodiments, the number of differentiators 404 equals the number of integrators 408.

Figure 5:
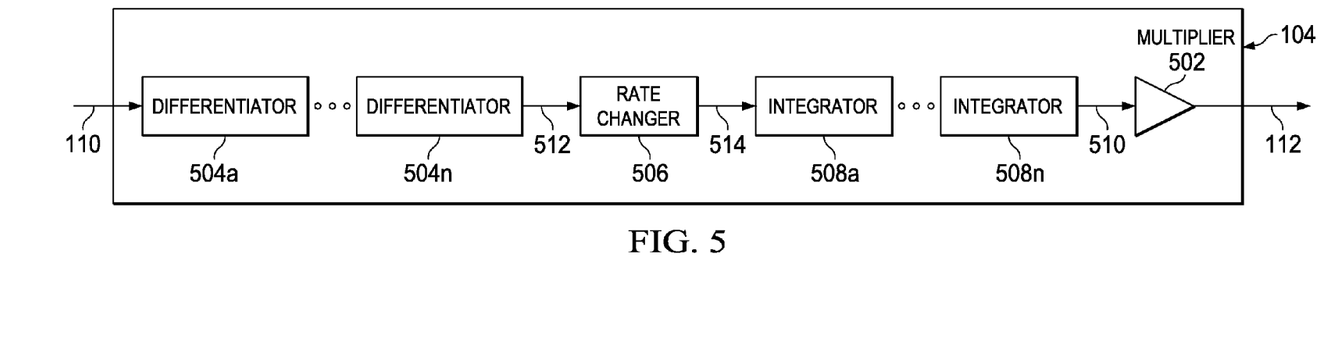
FIG. 5 shows a block diagram of an illustrative CIC filter with a multiplier in accordance with various embodiments.

FIG. 5 shows a block diagram of an illustrative CIC filter 104 with a multiplier 502 in accordance with various embodiments. The embodiment shown in FIG. 5 is similar to the embodiments shown in FIGS. 2, 3, and 4 except that multiplier 502 from FIG. 5 is located in a different location within CIC filter 104 than multipliers 202, 302, and 402 from FIGS. 2, 3, and 4 respectively. In the embodiment shown in FIG. 5, CIC filter 104 includes multiplier 502, differentiators 504a-404n, rate changer 506, and integrators 508a-408n. While multiple differentiators 504 and integrators 508 are depicted, any number of differentiators 504 and integrators 508, including only one each, may be included in CIC filter 104.

In the example of FIG. 5, input signal 110 is received by differentiators 504. Differentiators 504 preferably are comb filter pairs which differentiate input signal 110 to produce a differentiated input signal 512. The differentiated input signal 512 is directly proportional to the rate of change (i.e., the time derivative) of the input signal (i.e., input signal 110). Differentiators 504, thus, provide a delayed version of input signal 110 to produce differentiated input signal 512.

Rate changer 506 receives differentiated input signal 512 and changes the sample rate of the signal. In an embodiment, rate changer 506 may be an upsampler (e.g., zero-stuffer) which upsamples the sample rate of differentiated input signal 512 to produce an upsample signal 514. Thus, the sample rate of upsample signal 514 is higher than the sample rate of input signal 110. Integrators 508 receive the upsample signal 514 and integrate the signal. Thus, integrators 508 produce an integrated signal 510 that is a time integral of upsample signal 514.

Integrated signal 510 is received by multiplier 502. Multiplier 502, in an embodiment, is a multiplier that generates a scaled version of its input signal. For example, integrated signal 510 is received by multiplier 502 which multiplies the amplitude of the integrated signal 510 to create output signal 112. Output signal 112 thus has an amplitude that is a multiple of the integrated signal 510, but the frequency and sample rate remain the same. Output signal 112 then may be received by DAC 106.

Multiplier 502 is programmable and configured to increase the amplitude of output signal 112. In other words, the multiplication value of multiplier 502 is programmable and may be programmed such that the amplitude of output signal 112 is higher than if CIC filter 104 did not have multiplier 502. Without multiplier 502, in some embodiments, output signal 112 would have a lower amplitude than input signal 110, therefore, multiplier 502 may be programmed to increase the amplitude of output signal 112 such that it is the same as the amplitude of input signal 110. In other words, multiplier 502 may be configured to increase the amplitude of output signal 112 so that there is not a loss of amplitude in the output signal 112 of CIC filter 104.

The multiplication value of multiplier 502 may be based on the interpolation rate of rate changer 506 and/or the CIC filter 104 order. In other words, the multiplication value of multiplier 502 depends on the interpolation rate and/or the CIC filter 104 order. The CIC filter 104 order is the number of differentiators 504 or the number of integrators 508 in CIC filter 104. In some embodiments, the number of differentiators 504 equals the number of integrators 508.

Figure 6A:
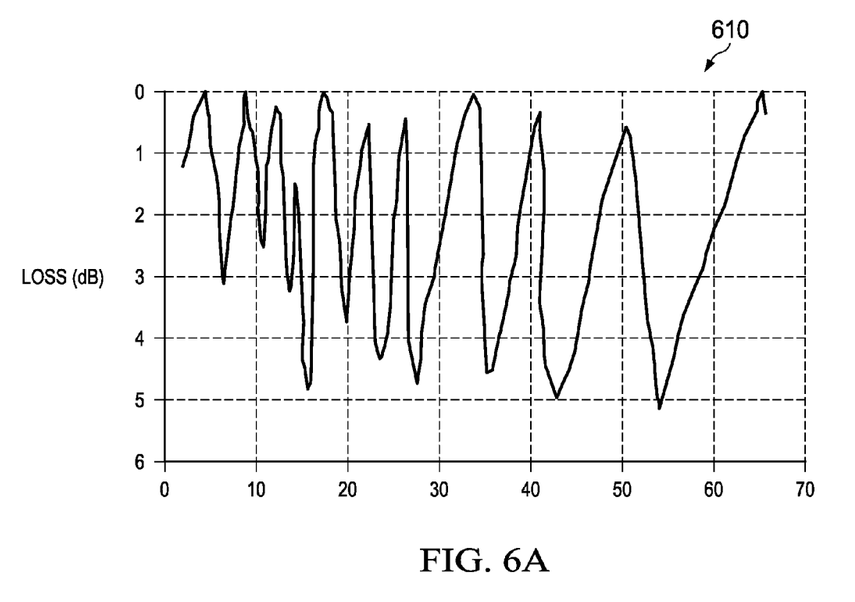
FIGS. 6A and 6B show example loss amplitude curves for an output signal from a CIC filter in accordance with various embodiments.
Figure 6B:
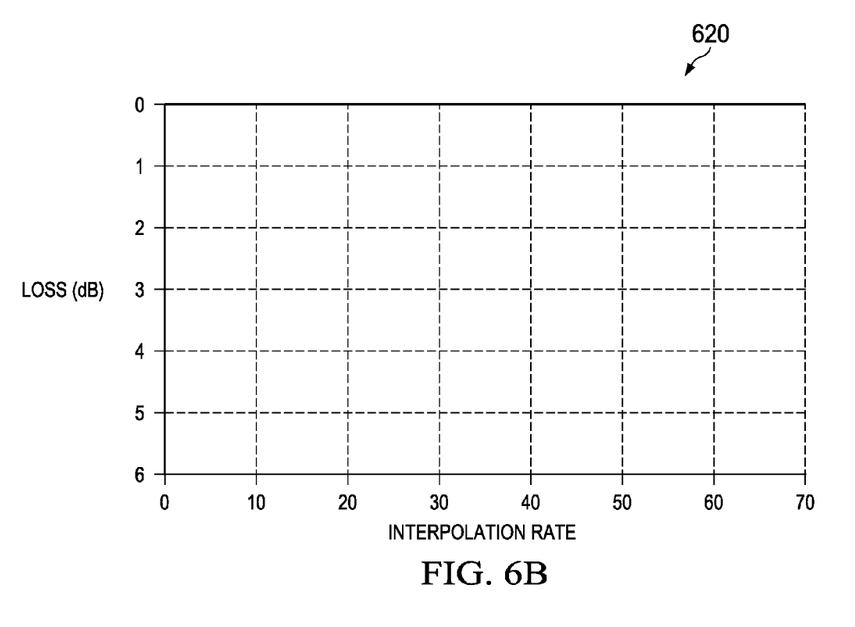

FIGS. 6A and 6B show example loss amplitude curves 610 and 620 from an input signal to an output signal for a CIC filter without a multiplier for curve 610 and for CIC filter 104 with a multiplier 202, 302, 402, or 502 in accordance with various embodiments. The relative amplitude growth of an input signal to an output signal is given by $R^{N-1}$ in a CIC filter which does not have a multiplier, where R is the interpolation rate of the CIC's rate changer and N is the CIC filter order (i.e., the number of differentiators or number of integrators in the CIC filter). Thus, the number of bits required for an output signal is given by ceil($\log_2(R^{N-1})$). Hence, a loss in amplitude from an input signal to output signal for certain interpolation rates occurs where a CIC filter does not have a multiplier. This loss may be quantified as 20

$$\log_{10}\left[\frac{R^{N-1}}{\lceil 2\log_2 R^{N-1} \rceil}\right].$$

Loss amplitude curve 610 shows the amount of amplitude lost when comparing an input signal to an output signal in a CIC filter, if the CIC filter does not have a multiplier. As indicated by loss amplitude curve 610, there is a loss of amplitude from the input signal to the output signal for CIC filters that do not have multipliers except when the interpolation rate is a power of 2 interpolation rate (i.e., 2, 4, 8, 16, 32, 64, etc.). In some cases, the loss of amplitude can be almost 6 decibels.

Loss of amplitude curve 620 shows the amount of amplitude lost when comparing input signal 110 to output signal 112 in CIC filter 104 which includes multiplier 202, 302, 402, or 502. For all interpolation rates, the loss of amplitude curve 620 remains 0. In other words, there is no loss of amplitude for CIC filter 104 due to the multiplier 202, 302, 402, or 502. Because the loss of amplitude for a CIC filter without a multiplier depends on the interpolation rate and the CIC filter order, the multiplication value of multiplier 202, 302, 402, or 502 is based on the interpolation rate and/or the CIC filter order (i.e., the number of differentiators 204, 304, 404, or 504 or the number of integrators 208, 308, 408, or 508).

Because the multiplication value is programmable in the multiplier 202, 302, 402, or 502, the multiplication value may be set such that the amplitude of output signal 112 may equal the amplitude of input signal 110 for various interpolation rates and various CIC filter orders. In alternative embodiments, multiplier 502 may be programmed to increase the amplitude of output signal 112 such that it is integer scale (such as $R^{N-1}$ scale) of input signal amplitude 110. In this embodiment, the amplitude level of input signal 110 and output signal 112 are different (e.g., 4 times, 8 times, etc.) but multiplier 202, 302, 402, or 502 scales a signal such that the amplitude of output signal 112 is a power of 2 of the amplitude of input signal 110 (e.g., the multiplicand is ⅔ if the initial amplitude scaling is 3 times).

In the case that the interpolation rate is an integer power of 2 interpolation rate (i.e., 2, 4, 8, 16, 32, 64, etc.) in rate changer 206, 306, 406, or 506, the multiplication value may be 1. In other words, if CIC filter 104 has a power of 2 interpolation rate, no multiplication is required to increase output signal 112 because there is no loss of amplitude from input signal 110 to output signal 112 even without a multiplier. In alternative embodiments, if CIC filter 104 has a power of 2 interpolation rate, a bypass may be implemented such that multiplier 202, 302, 402, or 502 need not multiply any signal because there is no loss of amplitude from input signal 110 to output signal 112 even without a multiplier.

Figure 7:
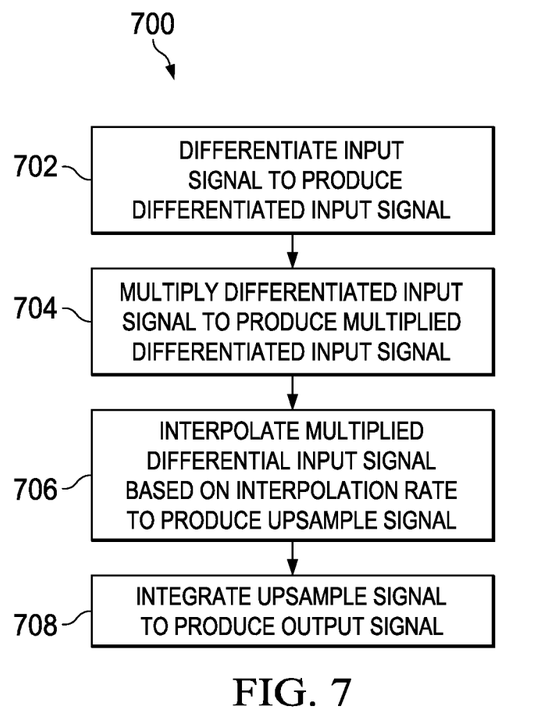
FIG. 7 shows a flow diagram of a method for producing a signal in a CIC filter in accordance with various embodiments.

FIG. 7 shows a flow diagram of a method 700 for producing a signal in a CIC filter 104 in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 700, as well as other operations described herein, can be performed by CIC 104 including multipliers 202, 302, 402, and 502, differentiators 204, 304, 404, and 504, rate changers 206, 306, 406, and 506, integrators 208, 308, 408, 508 and implemented by a processor executing instructions stored in a non-transitory computer readable storage medium.

The method 700 begins in block 702 with differentiating an input signal 110 to produce a differentiated input signal 312. In block 704, method 700 continues with multiplying, utilizing multiplier 302, the differentiated input signal 312 by a multiplication value to produce a multiplied differentiated input signal 310. The multiplication value is based on an interpolation rate.

In block 706, the method 700 continues with interpolating the multiplied differential input signal 310 based on the interpolation rate to produce an upsample signal 314. In block 708, the method 700 continues with integrating the upsample signal 314 to produce an output signal 112.

In an embodiment, the multiplication value is programmable and is further based on a total number of integrators 308 in CIC filter 104 or based on a total number of differentiators 304 in CIC filter 104. The multiplication value also may be set such that the amplitude of output signal 314 equals the amplitude of input signal 110.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A cascaded integrator-comb (CIC) filter, comprising:
   a differentiator configured to differentiate an input signal to produce a differentiated input signal;
   a rate changer coupled to the differentiator, the rate changer configured to interpolate the differentiated input signal based on an interpolation rate to produce an upsample signal;
   an integrator coupled to the rate changer, the integrator configured to integrate the upsample signal to produce an output signal; and
   a multiplier coupled to the differentiator, rate changer, and integrator, the multiplier configured to increase the output signal amplitude based on the interpolation rate.

2. The CIC filter of claim 1, wherein the multiplier is configured to increase the output signal amplitude by multiplying the differentiated input signal prior to the differentiated input signal being received by the rate changer.

3. The CIC filter of claim 1, wherein the multiplier is configured to increase the output signal amplitude by multiplying the upsample signal prior to the upsample signal being received by the integrator.

4. The CIC filter of claim 1, further comprising:
   a plurality of differentiators; and
   a plurality of integrators, the number of integrators equaling the number of differentiators,
   wherein the multiplier is further configured to increase the output signal amplitude based on the number of integrators.

5. The CIC filter of claim 1, wherein the multiplier is configured to increase the output signal amplitude by multiplying one of the input signal, the differentiated input signal, and the upsample signal prior to integrating the upsample signal.

6. The CIC filter of claim 1, wherein the multiplier is configured to increase the output signal amplitude such that the output signal amplitude is an integer scale of the input signal amplitude.

7. The CIC filter of claim 1, wherein the multiplier has a multiplication value that is programmable.

8. The CIC filter of claim 6, further comprising a bypass configured to bypass the multiplier based on the interpolation rate equaling an integer power of 2.

9. A system, comprising:
   a digital signal processor (DSP) configured to produce an input signal at a first rate;
   a cascaded integrator-comb (CIC) filter coupled to the DSP, the CIC configured to receive the input signal, differentiate the input signal to produce a differentiated input signal, interpolate the differentiated input signal to produce a second signal, integrate the second signal to produce an output signal at a second rate based on an interpolation rate; and
   a digital-to-analog converter (DAC) coupled to the DSP and CIC, the DAC configured to receive the output signal, wherein the CIC comprises a multiplier configured to increase the output signal amplitude based on the interpolation rate.

10. The system of claim 9, wherein the multiplier is further configured to increase the output signal amplitude by multiplying one of the input signal, the differentiated input signal, and the second signal prior to integrating the second signal.

11. The system of claim 9, wherein the CIC filter further comprises a plurality of integrators and the multiplier is further configured to increase the output signal amplitude based on the total number of integrators.

12. The system of claim 9, wherein the CIC filter further comprises a plurality of differentiators configured to differentiate the input signal to produce a differentiated input signal.

13. The system of claim 12, wherein the multiplier is configured to increase the output signal amplitude by multiplying the differentiated input signal by a multiplication value.

14. The system of claim 13, wherein the multiplication value is programmable in the multiplier.

15. The system of claim 14, wherein the multiplication value equals one based on the interpolation rate equaling an integer power of 2.

16. The system of claim 9, wherein the CIC further comprises a rate changer to interpolate the differentiated input signal to produce an upsample signal at the second rate and the multiplier is further configured to increase the output signal amplitude by multiplying the upsample signal by a multiplication value.

17. A method of producing a signal in a cascaded integrator-comb (CIC) filter comprising:

differentiating an input signal to produce a differentiated input signal;

interpolating the differentiated input signal based on an interpolation rate to produce an upsample signal; and integrating the upsample signal to produce an output signal.

18. The method of claim 17, comprising multiplying one of the input signal, the differentiated input signal, and the upsample signal by a multiplication value prior to the step of integrating, the multiplication value being based on the interpolation rate.

19. The method of claim 18, wherein the multiplication value is further based on a total number of integrators located in the CIC.

20. The method of claim 18, wherein the multiplication value is further based on a total number of differentiators located in the CIC.

* * * * *